United States Patent
Merrill et al.

(10) Patent No.: US 6,606,120 B1
(45) Date of Patent: Aug. 12, 2003

(54) MULTIPLE STORAGE NODE FULL COLOR ACTIVE PIXEL SENSORS

(75) Inventors: Ricahrd B. Merrill, Woodside, CA (US); Richard F. Lyon, Los Altos, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 09/290,361

(22) Filed: Apr. 12, 1999

Related U.S. Application Data

(63) Continuation-in-part of application No. 09/121,175, filed on Jul. 22, 1998, and a continuation-in-part of application No. 09/065,939, filed on Apr. 24, 1998, now Pat. No. 5,965,875.

(51) Int. Cl.[7] .............................. H04N 3/14; G01J 3/50
(52) U.S. Cl. ....................... 348/273; 348/301; 348/308; 348/311; 250/226
(58) Field of Search ................................ 348/272, 273, 348/274, 277, 300, 301, 302, 308, 311; 250/208.1, 226, 214.1; 257/440, 458, 463, 291, 292

(56) References Cited

U.S. PATENT DOCUMENTS

| | | |
|---|---|---|
| 3,971,065 A | 7/1976 | Bayer ........................... 358/41 |
| 4,011,016 A | 3/1977 | Layne et al. ................. 356/195 |
| 4,238,760 A | 12/1980 | Carr ............................. 357/30 |
| 4,309,604 A | 1/1982 | Yoshikawa et al. ......... 250/226 |
| 4,613,895 A | 9/1986 | Burkey et al. ................ 358/41 |
| 4,651,001 A | 3/1987 | Harada et al. .............. 250/330 |
| 4,677,289 A * | 6/1987 | Nozaki et al. .............. 250/226 |
| 5,397,734 A | 3/1995 | Iguchi et al. ................. 437/70 |
| 5,471,515 A * | 11/1995 | Fossum et al. ............. 257/292 |
| 5,502,299 A | 3/1996 | Standley .................. 250/208.2 |
| 5,668,596 A | 9/1997 | Vogel .......................... 348/222 |
| 5,739,562 A * | 4/1998 | Ackland et al. ............ 257/291 |
| 5,883,421 A | 3/1999 | Ben Chouikha et al. .... 257/461 |
| 5,965,875 A * | 10/1999 | Merrill ........................ 250/226 |
| 5,981,932 A * | 11/1999 | Guerrieri et al. ......... 250/208.1 |
| 6,078,037 A | 6/2000 | Booth, Jr. ................. 250/208.1 |
| 6,150,683 A * | 11/2000 | Merrill et al. .............. 257/292 |
| 2002/0180875 A1 * | 12/2002 | Guidash ...................... 348/308 |

FOREIGN PATENT DOCUMENTS

| | | | |
|---|---|---|---|
| DE | WO98/19455 | 10/1996 | ............ H04N/3/15 |
| EP | 0605898 | 7/1994 | ......... H01L/27/146 |

OTHER PUBLICATIONS

Albert J.P. Theuwissen, "Solid–State Imaging with Charge–Coupled Devices", Kluwer Academic Publishers, pp. 131–141.

Savvas G. Chamberlain, "Photosensitivity and Scanning of Silicon Image Detector Arrays", IEEE Journal of Solid–State Circuits, vol. SC–4, No. 6, Dec. 1969, pp. 333–342.

(List continued on next page.)

*Primary Examiner*—Wendy R. Garber
*Assistant Examiner*—Luong Nguyen
(74) *Attorney, Agent, or Firm*—Sierra Patent Group, Ltd.

(57) ABSTRACT

An active pixel sensor is disposed on a semiconductor substrate of a first conductivity type, and comprises a plurality of semiconductor regions disposed in the substrate, each successive one of the semiconductor regions being enclosed entirely within another enclosing one of the semiconductor regions. The plurality of semiconductor regions alternates between the first conductivity type and a second conductivity type opposite to that of the first conductivity type. A first enclosing one of the semiconductor regions containing all other ones of the semiconductor regions is of the second conductivity type, such that a plurality of series-connected photodiodes is formed between the substrate and an innermost enclosed one of the semiconductor regions. A plurality of reset switches each has a first terminal coupled to a different one of the alternating semiconductor regions, and a second terminal switchably coupled to a reset potential. Each one of a plurality of storage nodes is coupled to a separate one of the plurality of alternating semiconductor regions.

18 Claims, 13 Drawing Sheets

OTHER PUBLICATIONS

D. Knipp, et al. "Low Cost Approach to Realize Novel Detectors for Color Recognition", pp. 350–353.

Mohamed Ben Chouikha et al. Color sensitive photodetectors in standard CMOS and BiCMOS technologies, SPIE vol. 2950, Aug. 1996, pp. 108–120.

Don Sutherland, "The Latest in Digital SLRs", Neaveau Niche, Shutterbug, Nov. 97, pp. 194–195, 202, 208, 210.

Bob Weibel, "High–end digital cameras can make professional indoor photography a snap", Buyer's Guide Studio Audience, Published Apr. 1997, pp. 71–78.

Ken Parulski, et al., "Enabling technologies for a family of digital cameras", Invited Paper, SPIE vol. 2654, pp. 156–163.

Hon–Sum Wong, "Technology and Device Scaling Considerations for CMOS Imagers", Senior Member, IEEE, Transactions on Electron Devices, vol. 43, No. 12, Dec. 1996, pp. 2131–2142.

M. Ben Chouikha, et al. "Buried Triple p–n Junction Structure in BiCMOS Technology for Color Detection", Laboratories des Instruments et Systems, Case 525, Fine Woodworking, Sep. 28, 1997, pp. 108–111.

Miura et al. "A 100Frame/s CMOS Active Pixel Sensor for 3D–Gesture Recognition System" 1999 IEEE pp. 142–143.

* cited by examiner

MULTIPLE STORAGE NODE FULL COLOR ACTIVE PIXEL SENSORS

RELATED APPLICATIONS

This application is a continuation-in-part of U.S. patent application, Ser. No. 09/121,175, filed Jul. 22, 1998, and U.S. patent application, Ser. No. 09/065,939, filed Apr. 24, 1998 now U.S. Pat. No. 5,965,875.

BACKGROUND OF THE INVENTION

1. Field of the Invention

The present invention relates to active pixel sensors and active pixel sensor arrays. More particularly, the present invention relates to arrays of active pixel sensors wherein each of the active pixel sensors is a triple-junction structure to ensure that each pixel sensor in the array measures each of the three primary colors (R-G-B) in the same location. The active pixel array employs the triple-junction structure of the active pixel sensor to achieve color separation due to the differences in absorption length in silicon of light of different wavelengths. The active pixel array further employs storage nodes to hold a signal after an exposure time has finished and throughout a readout process.

2. The Background Art

Semiconductor devices for measuring the color of light are known in the non-imaging art. These devices have been built with a variety of technologies that depend upon the variation of photon absorption depth with wavelength. Examples are disclosed in U.S. Pat. No. 4,011,016, entitled "Semiconductor Radiation Wavelength Detector" and U.S. Pat. No. 4,309,604, entitled "Apparatus for Sensing the Wavelength and Intensity of Light." Neither patent discloses either a structure for a three-color integrated circuit color sensor or an imaging array.

In the imaging art, CCD devices with multiple buried channels for accumulating and shifting photocharges are known. These devices are difficult and expensive to manufacture and have not been practical for three-color applications. U.S. Pat. No. 4,613,895, entitled "Color Responsive Imaging Device Employing Wavelength Dependent Semiconductor Optical Absorption" discloses an example of such a device. This category also includes devices that use layers of thin-film photosensitive materials applied on top of an imager integrated circuit. Examples of this technology are disclosed in U.S. Pat. No. 4,677,289, titled "Color Sensor" and U.S. Pat. No. 4,651,001, entitled "Visible/Infrared Imaging Device with Stacked Cell Structure." These structures are also difficult and expensive to make, and have not become practical.

Also known in the imaging art are color imaging integrated circuits that use a color filter mosaic to select different wavelength bands at different photosensor locations. U.S. Pat. No. 3,971,065, entitled "Color Imaging Array", discloses an example of this technology. As discussed by Parulski et al., "Enabling Technologies for Family of Digital Cameras", 156/SPIE Vol. 2654, 1996, one pixel mosaic pattern commonly utilized in digital cameras is the Bayer color filter array (CFA) pattern.

Shown in FIG. 1, the Bayer CFA has 50% green pixels arranged in a checkerboard. Alternating lines of red and blue pixels are used to fill in the remainder of the pattern. As shown in FIG. 2, the Bayer CFA pattern results in a diamond-shaped Nyquist domain for green and smaller, rectangular-shaped Nyquist domains for red and blue. The human eye is more sensitive to high spatial frequencies in luminance than in chrominance, and luminance is composed primarily of green light. Therefore, since the Bayer CFA provides the same Nyquist frequency for the horizontal and vertical spatial frequencies as a monochrome imager, it improves the perceived sharpness of the digital image.

These mosaic approaches are known in the art to be associated with severe color aliasing problems due to the facts that the sensors are small compared to their spacing, so that they locally sample the image signal, and that the sensors for the different colors are in different locations, so that the samples do not align between colors. Image frequency components outside of the Nyquist domain are aliased into the sampled image with little attenuation and with little correlation between the colors.

As pointed out above in the discussion of CCD color imaging arrays, the semiconductor processes employed in manufacturing the arrays can be both difficult and expensive to implement. There are, however, CMOS technologies that are known which may be implemented with less expense and greater ease.

Referring to FIG. 3, many modern CMOS integrated circuit fabrication processes use a "twin-well" or "twin-tub" structure in which a P well region 10 and a N well region 12 of doping density approximately $10^{17}$ atoms/cm$^3$ are used as regions within which to make N-channel and P-channel transistors, respectively. The substrate material 14 is typically a more lightly doped P-type silicon ($10^{15}$ atoms/cm$^3$), so the P well 10 is not isolated from the substrate 14. The N-channel FET 16 formed in the P well 10 includes N+normal source/drain diffusions 18 at a dopant concentration of>$10^{18}$ atoms/cm$^3$ and N-type shallow lightly doped diffusion (LDD) regions 20 at a concentration of approximately $10^{18}$ atoms/cm$^3$. The P-channel FET 22 formed in the N well region 12 is similarly constructed using normal P+source/drain regions 24 and shallow LDD regions 26 of similar dopant concentrations.

Referring to FIG. 4, in an improved process, known as "triple well", an additional deep N isolation well 28 is used to provide junction isolation of the. P well 10 from the P substrate 14. The dopant density of the N isolation well 28 ($10^{16}$ atoms/cm$^3$) lies between the dopant densities of P substrate 14 and P well 10 ($10^{15}$ atoms/cm$^3$ and $10^{17}$ atoms/cm$^3$, respectively). U.S. Pat. No. 5,397,734, entitled "Method of Fabricating a Semiconductor Device Having a Triple Well Structure", discloses an example of triple well technology.

Triple well processes are becoming popular and economical for manufacturing MOS memory (DRAM) devices, since they provide effective isolation of dynamic charge storage nodes from stray minority carriers that may be diffusing through the substrate.

Storage pixel sensors are also known in the art. In a storage pixel, data representing intensity of light received by a phototransducer are stored in a storage element that can be read out and cleared using appropriate control circuitry.

Accordingly, it is an object of the present invention to provide a color imaging array in which three color bands are sensed with detectors each in the same location, with sensitive areas that are not very small compared to their spacing, such that aliased image components are attenuated, and such that the color samples are aligned between colors.

It is a further object of the present invention to provide an active pixel color imaging array that can be fabricated using a standard modern CMOS memory process.

It is another object of the present invention to provide an array of active pixel sensors having multiple storage nodes for capturing a color image.

BRIEF DESCRIPTION OF THE INVENTION

The present invention is directed to color separation in an active pixel MOS imaging array utilizing a triple-junction pixel cell structure to take advantage of the differences in absorption length in silicon of light of different wavelengths to measure different colors in the same location with sensitive areas almost as large as their spacing.

In the present invention a color photosensor structure that separates blue, green and red light is formed in a P-type silicon body. The color photosensor structure comprises a vertical PNPN device that implements a triple stacked photodiode and includes a first N-doped region formed in the P-type silicon body, a P-doped region formed in the first N-doped region, and a second N-doped region formed in the P-doped region. A triple well process is employed according to the present invention to fabricate the color photosenor structure. The normal N well of the triple well CMOS process is not employed in the color photosenor structure of the present invention, although it may be useful to use it on the same chip, outside of the array of imager cells.

In the color photosensor structure, the pn junction formed between the P-type silicon body and the first N-doped region defines a red-sensitive photodiode at a depth in the silicon approximately equal to the absorption length of red light in silicon, the pn junction formed between the first N-doped region and the P-doped region defines a green-sensitive photodiode at a depth in the silicon approximately equal to the absorption length of green light in silicon, and the pn junction formed between the P-doped region and the second N-doped region defines a blue-sensitive photodiode at a depth in the silicon approximately equal to the absorption length of blue light. Sensing circuitry is connected to the red, green and blue photodiodes to integrate and store respective photodiode currents.

The present invention reduces color aliasing artifacts by ensuring that all pixels in an imaging array measure red, green and blue color response in the same place in the pixel structure. Color filtration takes place by making use of the differences in absorption length in silicon of the red, green and blue light.

The present invention provides advantages in addition to reduction of color aliasing. For example, it eliminates the complex polymer color filter array process steps common in the prior art. Instead, a triple-well process, which is commonly available in the semiconductor industry is used. Also, overall efficiency of use for available photons is increased. With the traditional approach, photons not being passed by the filter material are absorbed in the filter and wasted. With the approach of the present invention, the photons are separated by absorption depth, but are all collected and used. This can result in an overall improvement in quantum efficiently by around a factor of three.

The present invention provides an excellent example of an imager that would be difficult to implement with conventional CCD technology. In addition, the present invention benefits from the availability of scaled CMOS processing, in the sense that there are many support transistors in each three-color pixel.

According to another aspect of the present invention, the triple-diode sensors of the present invention are employed in active pixel sensors having multiple storage nodes suitable for use in an array of storage pixel sensors.

In a first embodiment of an active pixel according to the present invention, the active pixel sensor includes a plurality of storage nodes. Each storage node stores a pixel of one color of the image. One row select line is provided for selecting the plurality of storage nodes, and a plurality of column output lines are provided upon which the images stored in the plurality of storage nodes may be read out. Column circuits may be employed to perform a function, such as matrixing for color space conversion, on the images stored on the plurality of storage nodes.

In a second embodiment of an active pixel according to the present invention, the active pixel sensor includes a plurality of storage nodes, a plurality of row select lines connected to the plurality of storage nodes and a single column output line upon which the images stored in the plurality of storage nodes may be read out. One or more row decoding circuits may be connected to the row select lines to select a row of one of the stored images within the storage nodes.

In third and fourth embodiments of an active pixel according to the present invention, one of which provides a current-mode output, the active pixel sensor includes a plurality of storage nodes, a plurality of image select signals for selecting the plurality of storage nodes, and a single row select line for placing selected images on a column output line. The use of the image select signals in combination with the row select transistor eliminates the need for the multiple row select signals of the third embodiment.

In a fifth embodiment of an active pixel according to the present invention, the active pixel sensor includes multiple storage nodes, multiple row select lines, and multiple column output lines.

DETAILED DESCRIPTION OF THE PREFERRED EMBODIMENTS

Those of ordinary skill in the art will realize that the following description of the present invention is illustrative only and not in any way limiting. Other embodiments of the invention will readily suggest themselves to such skilled persons.

Figure 5:
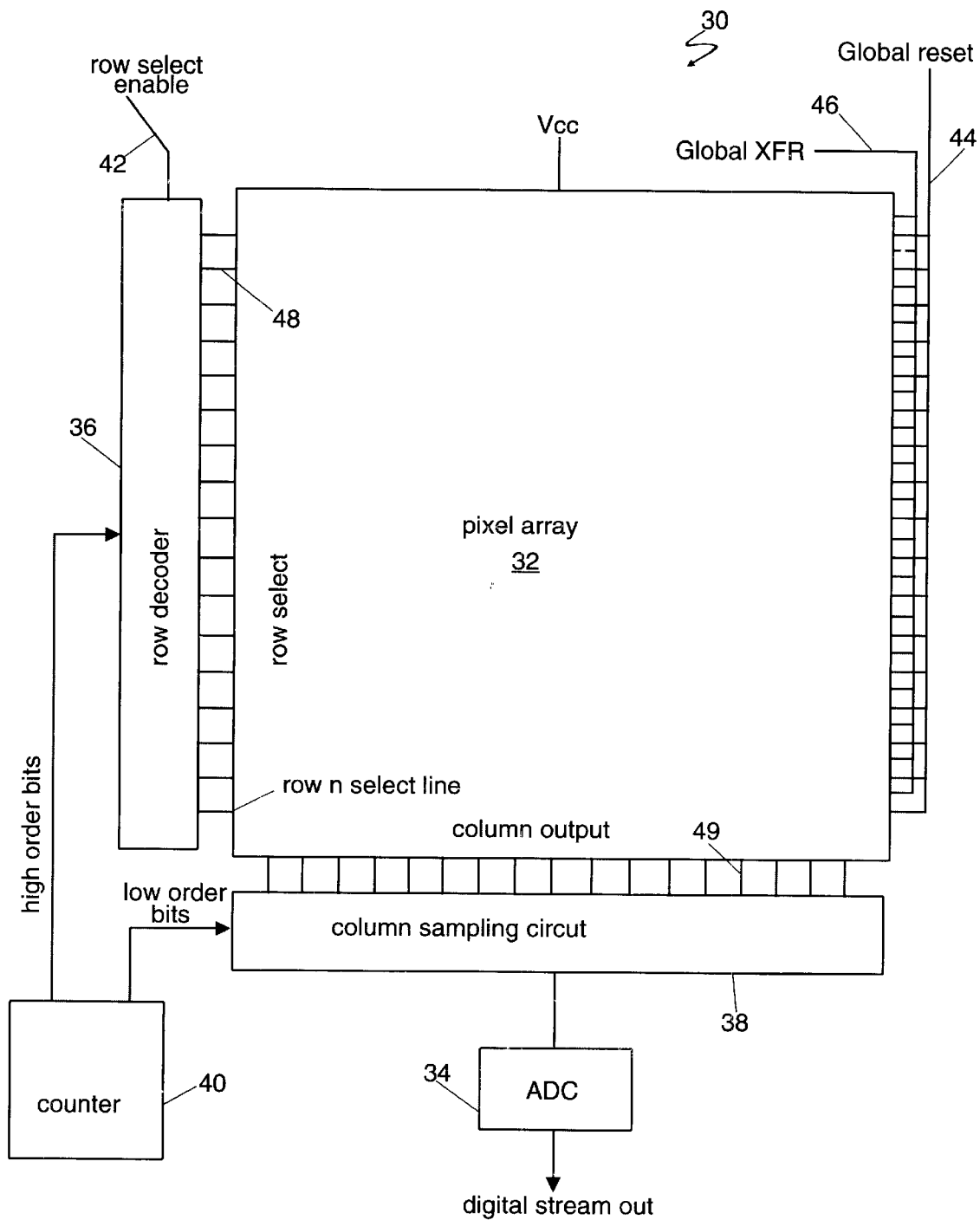
FIG. 5 is a block diagram of an imager suitable for use with the embodiments of active pixel sensors according to the present invention

FIG. 5 is a block diagram of an active pixel imager 30 suitable for use according to the present invention. In the imager 30, the active pixel sensors are arranged in rows and columns in a pixel sensor array 32. To extract the analog pixel information from the pixel sensor array 32 for processing by an analog-to-digital converter (ADC) 34, a row decoder circuit 36, a column sampling circuit 38, and a counter 40 are employed. The row decoder 34 selects rows from the pixel sensor array 32 in response to a row enable signal 42 and signals from the counter 40. The column sampling circuit 38 is also driven from the counter 40 and further includes a multiplexer that couples the sampled columns as desired to the ADC in response to signals from counter 40.

In a typical implementation, the higher-order bits from counter 40 are used to drive the row decoder circuit 6 and the lower-order bits are used to drive column sampling circuit 38 to permit extraction of all pixel information from a row in the pixel sensor array 32 prior to selection of the next row by row decoder circuit 6. Row decoders, column sampling circuits, and counters suitable for use in the imager 30 are well known to those of ordinary skill in the art, and will not be described herein in detail to avoid overcomplicating the disclosure and thereby obscuring the present invention.

Figure 6:
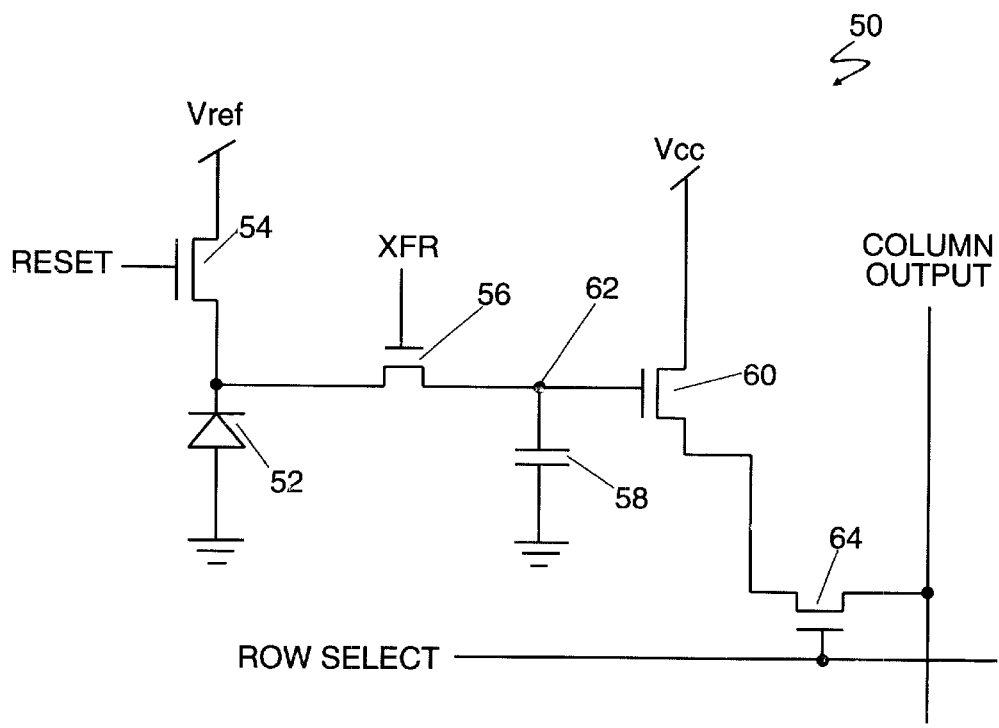
FIG. 6 is a schematic diagram of an N-channel MOS implementation of a known active pixel sensor circuit having a single storage node.

Referring now to FIG. 6, a schematic diagram of a known active pixel sensor 50 with a single embedded storage element is shown. The active pixel sensor 50 is implemented with N-channel MOS transistors. Those of ordinary skill in the art will appreciate that the active pixel sensor 50 may otherwise be implemented with all P-channel MOS transistors or a combination of P-channel and N-channel MOS transistors. In active pixel sensor 50, a photodiode 52 has an anode connected to ground and a cathode connected to the source of N-Channel MOS reset transistor 54. The drain of N-Channel MOS reset transistor 4 is connected to Vref and the gate of N-Channel MOS reset transistor 54 is connected to the global RESET line indicated by reference numeral 44 in FIG. 5. The RESET line is preferably driven to a voltage at least a threshold above Vref to set the cathode of the photodiode 52 to Vref.

The cathode of photodiode 52 is also connected to a first source/drain of N-channel MOS transfer transistor 56. A second source/drain of N-Channel MOS transfer transistor 56 is connected to a first terminal of a storage element 58 and also to the gate of N-channel MOS readout transistor 60. A second terminal of the storage element 58 is connected to reference potential shown as ground. The gate of N-Channel MOS transfer transistor 56 is connected to the global XFR line indicated by reference numeral 46 in FIG. 5. The connection of the second source/drain of N-Channel MOS transfer transistor 56 to the first terminal of storage element 58 and also to the gate of N-Channel MOS transistor 60 forms a storage node 62. The drain of N-channel MOS readout transistor 60 is connected to Vcc, and the source of N-channel MOS readout transistor 60 is connected to the drain of N-channel MOS row select transistor 64. The gate of N-channel MOS row select transistor 64 is connected to a ROW SELECT line, one of which is depicted by reference numeral 48 in FIG. 5, and the source of N-channel MOS row select transistor 64 is connected to a column output line.

It should be appreciated that associated with the storage node 62 are the N-channel MOS transfer transistor 56 to isolate the storage node 62 from further collection of photocharge by the cathode of photodiode 52 when an integration period to be described below has ended, the N-channel MOS readout transistor 60 to sense the charge accumulated at storage node 62, and the storage element 58 to store charge. Further, as disclosed in co-pending application serial number 09/099,116, entitled "ACTIVE PIXEL SENSOR WITH BOOTSTRAP AMPLIFICATION", by inventors R. B. Merrill and Richard F. Lyon, filed on Jun. 17, 1998, and assigned to the same assignee as the present invention, and expressly incorporated herein by reference, the storage element 58 may be omitted and charge stored on the gate of N-channel MOS readout transistor 60 or that other capacitive means of charge storage may be employed.

Figure 7:
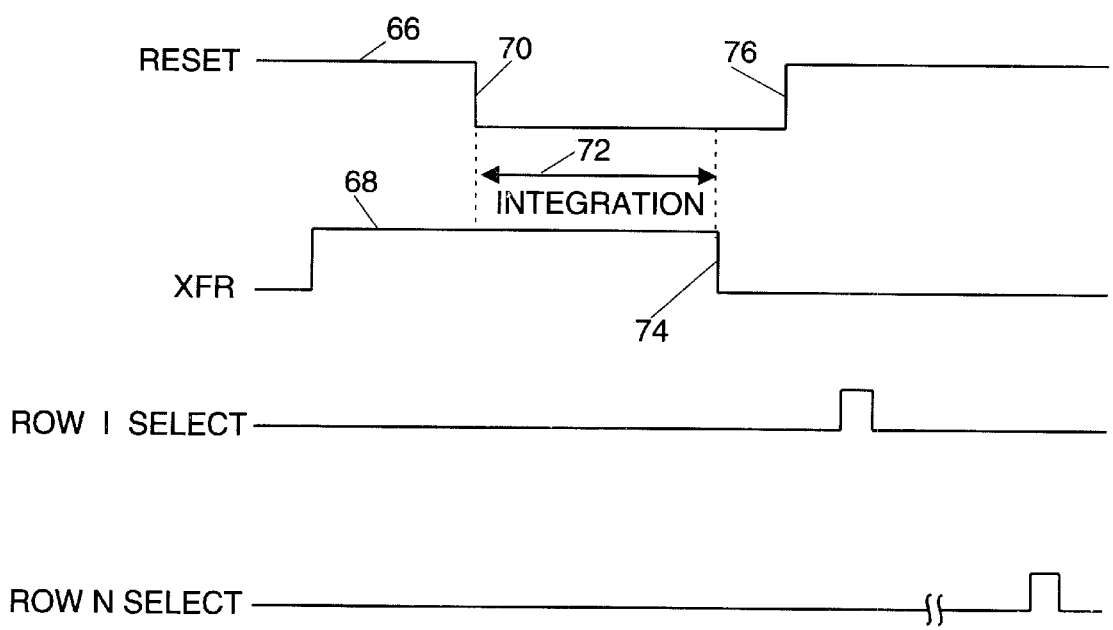
FIG. 7 is a timing diagram illustrating the operation of the active pixel sensor depicted in FIG. 6.

To better understand the operation of the active pixel sensor 50, the timing diagram of FIG. 7 illustrates the timing of the RESET, XFR and ROW SELECT signals depicted in FIG. 6. The active pixel 50 is reset by turning on both N-channel MOS reset transistor 54 and N-channel MOS transfer transistor 56 as shown by the HIGH level of both the RESET and XFR signals at 66 and 68. Then the N-channel MOS reset transistor 54 is turned off at the falling edge 70 of RESET 66 so that integration of photocurrent from photodiode 52 can begin. The photocurrent integration period is indicated by reference numeral 72.

While N-channel MOS transfer transistor 56 is turned on, the capacitance of the storage element 58 adds to the capacitance of the photodiode 52 during integration, thereby increasing the charge capacity and the range of the active pixel sensor 50. This also reduces variation in the pixel output due to capacitance fluctuations since gate oxide capacitance from which storage element 58 is formed is better controlled than junction capacitance of the photodiode 52.

When the integration is complete (determined by external exposure control), the N-channel MOS transfer transistor 56 turns off at falling edge 74 of XFR to isolate the voltage level corresponding to the integrated photocharge onto the storage element 58. Shortly thereafter, the photodiode 52 itself is preferably reset to the reference voltage by again turning on N-channel MOS reset transistor 54 as indicated by rising edge 76 of RESET. This action will prevent the photodiode 52 from continuing to integrate during the read out process and possibly overflowing excess charge into the body, possibly affecting the integrity of the signal on the storage element 58.

After the N-channel MOS transfer transistor 56 is turned off, the read out process can begin. Each of the active pixel sensors in a row is read when a ROW SELECT signal pulse as shown in FIG. 7 is applied to the gate of the N-channel MOS row select transistor 64 in an active pixel sensor 50. In the operation of active pixel sensor 50, a voltage related to the voltage found on storage node 62 is sensed by N-Channel MOS readout transistor 6 and placed on the column output line when N-channel row select transistor 64 is turned on. The XFR signal stays low until all of the rows have been read out or another cycle is initiated.

Figure 8:
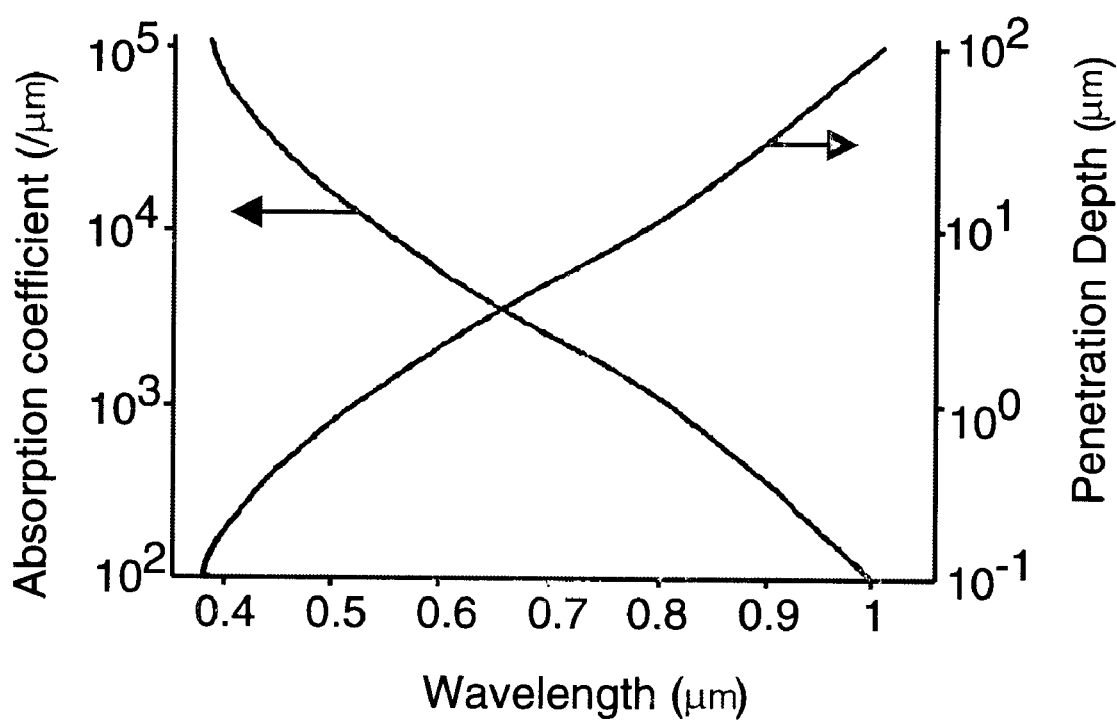
FIG. 8 is a graph plotting light absorption length in silicon versus wavelength.

FIG. 8 illustrates the light absorption length in silicon for light in the visible spectrum. It is well known that the longer the wavelength of light incident upon a silicon body, the deeper the light will penetrate into the silicon body before it is absorbed. As depicted, blue light having wavelengths in the range of about 400–490 nm will be absorbed in a silicon body primarily at a depth of about 0.2–0.5 microns, green light having wavelengths in the range of about 490–575 nm will be absorbed in the silicon body at a depth of about 0.5–1.5 microns, and red light having wavelengths in the range of about 575–700 nm will be absorbed in the silicon at a depth of about 1.5–3.0 microns.

Figure 9:
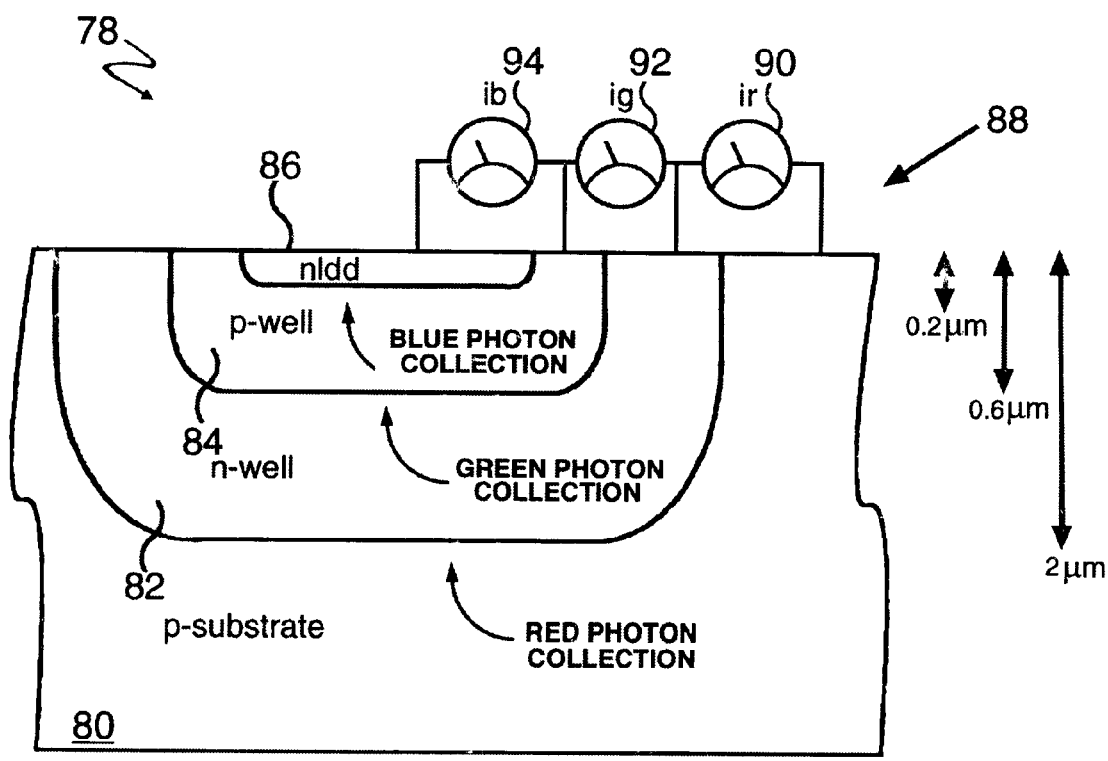
FIG. 9 is a partial cross-section drawing illustrating a three-color pixel sensor using a triple-junction structure in accordance with the concepts of the present invention.

In FIG. 9, according to the present invention, a triple-junction color photosensor structure 78 formed in a silicon body 80 of P-type conductivity (approx. $10^{15}$ atoms/cm$^2$) is illustrated. The color photosensor structure 78 includes a first N-type doped well region 82 (approx. $10^{16}$ atoms/cm$^3$) formed in the P-type silicon body 80, a doped well region 84 of P-type conductivity (approx. $10^{17}$ atoms/cm$^3$) formed in the first N-doped region 82, and a second doped region 86 of N-type conductivity (approx. $10^{18}$ atoms/cm$^3$) formed as a very shallow NLDD (N-type lightly doped drain) layer in the P-doped region 84.

Three pn junctions exist in the color photosensor structure 78. A first pn junction exists between the P-type silicon body 80 and the first N-doped region 82 at a depth of about 1.5 to about 3.0 microns. The first pn junction is preferably formed at the approximate absorption depth for red light of about 2 microns. A second pn junction exists between the P-doped region 84 and the first N-doped region 82 at a depth between about 0.5 to about 1.5 microns. The second pn junction is preferably formed at the approximate absorption depth for green light of about 0.6 microns. A third pn junction exists between the P-doped region 84 and the second N-doped region 86 at a depth of about 0.2 to about 0.5 microns. The third pn junction is preferably formed at the approximate absorption depth for blue light of about 0.2 microns. Accordingly, in the color photosensor structure 78, the first pn junction forms a red-sensitive photodiode, the second pn junction forms a green-sensitive photodiode, and the third pn junction forms a blue-sensitive photodiode.

Those skilled in the art will appreciate that the sensitive depletion regions of the diodes described above extends somewhat above and below their junction depths. Such skilled persons will also appreciate that the above-described triple-junction structure can be implemented using regions of opposite conductivities than disclosed in the example of FIG. 9, i.e., a first P-doped region in an N-type silicon substrate, an N-doped region in the first P-region and a second P-doped region in the N-region. However, such a structure is usually not used in the industry, and the structure of FIG. 9 is preferred since it uses standard triple-well MOS memory technology. Additionally, persons of ordinary skill in the art will appreciate that additional pn junctions could be for med at selected depths in the color photosensor structure 78 by forming additional doped regions to provide for the absorption of photons at additional selected wavelengths.

FIG. 9 further shows that the color photosensor structure of the present invention also includes a sensing mechanism 88 connected to the red, green and blue photodiodes for measuring red, green and blue photocurrents, respectively, across the three photodiodes. The photocurrent sensor 88 is illustrated as a conceptual arrangement that includes a first current meter 90 connected across the red-sensitive photodiode for measuring the red photocurrent ir. A second current meter 92 is connected across the green-sensitive photodiode for measuring the green photocurrent ig. A third current meter 94 is connected across the blue-sensitive photodiode for measuring the blue photocurrent ib. Assuming that most of the current in the photodiodes is collected in their depletion regions, those skilled in the art will clearly appreciate that the current ib will be primarily photocurrent of incident photons from the blue end of the visible spectrum, the current ig will be primarily current from green photons, and the current ir will be primarily current from red photons.

Figure 10:
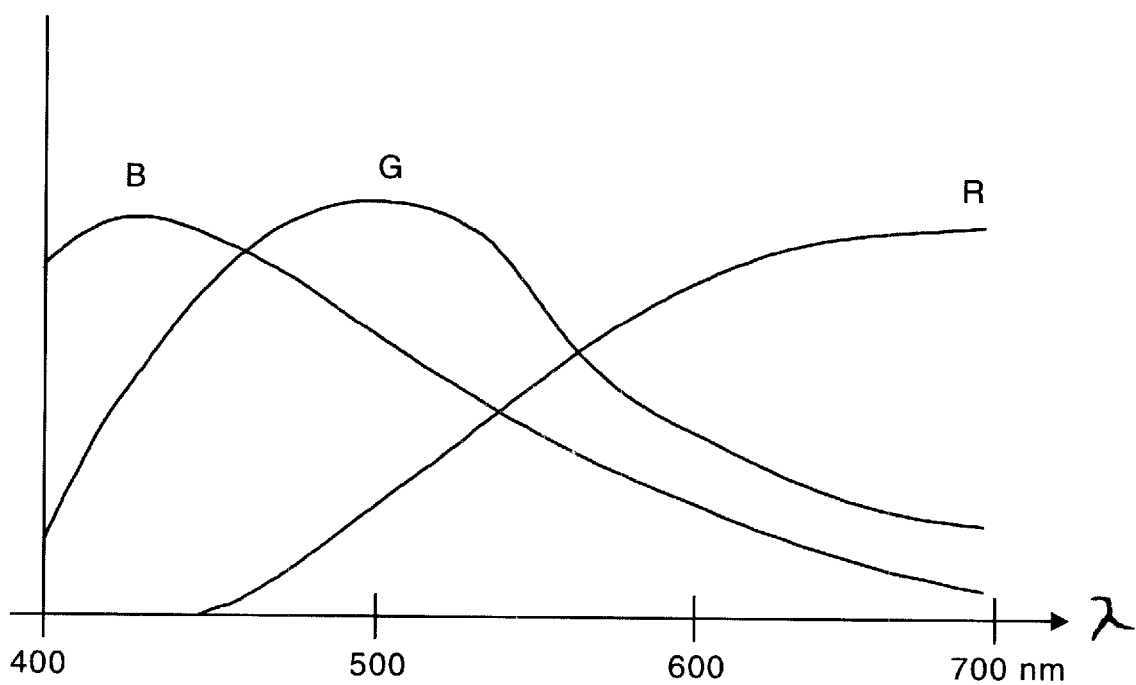
FIG. 10 is a graph showing a set of estimated sensitivity curves for the FIG. 8 triple-junction photodiode structure in accordance with the present invention.

FIG. 10 presents a set of estimated sensitivity curves for the triple stacked photodiode arrangement of the present invention, as a function of wavelength within the visible spectrum. The curves are only rather broadly tuned, as shown, rather than sharply tuned as in some other color separation approaches that are based on color filters. However, as is well known in the art of color imaging, it is possible with suitable matrixing to convert three measurements from such a set of curves into a more nearly calorimetrically correct set of red, green, and blue intensity values. Methods for estimating suitable matrix transformations are known in the art, and are disclosed, for example in U.S. Pat. No. 5,668,596, entitled "Digital Imaging Device Optimized for Color Performance."

According to the present invention, an imager 30 such as that illustrated in FIG. 5 has multiple storage nodes associated with each of the pixels in the pixel array 32. To capture a color image in the imager 30, each of the pixels employs the triple-photodiode color sensor structure 78 described with reference to FIG. 9. In each of the embodiments according to the present invention of the storage pixel sensors 100-1 through 100-5 depicted in FIGS. 11 through 15 herein, each of the three diodes in the triple-diode color photosensor structure 78 has a terminal that is coupled to at least one separate storage and readout circuit. The embodiments of storage pixel sensors 100-1 through 100-5 depicted in FIGS. 11 through 15 are implemented with N-channel MOS transistors. Those of ordinary skill in the art will appreciate that the storage pixel sensors below may otherwise be implemented with P-channel MOS transistors or a combination of N-channel and P-channel MOS transistors. Corresponding elements depicted in FIGS. 11 through 15 will be identified by the same reference numerals.

Figure 16A:
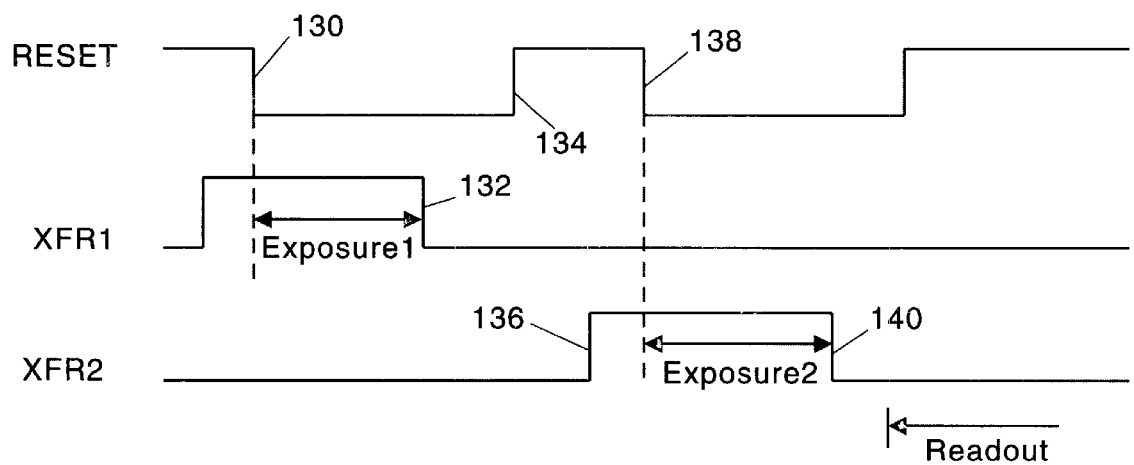
FIGS. 16A and 16B are alternative timing diagrams for the operation of the active pixel sensors depicted in FIG. 15 according to the present invention.
Figure 16B:
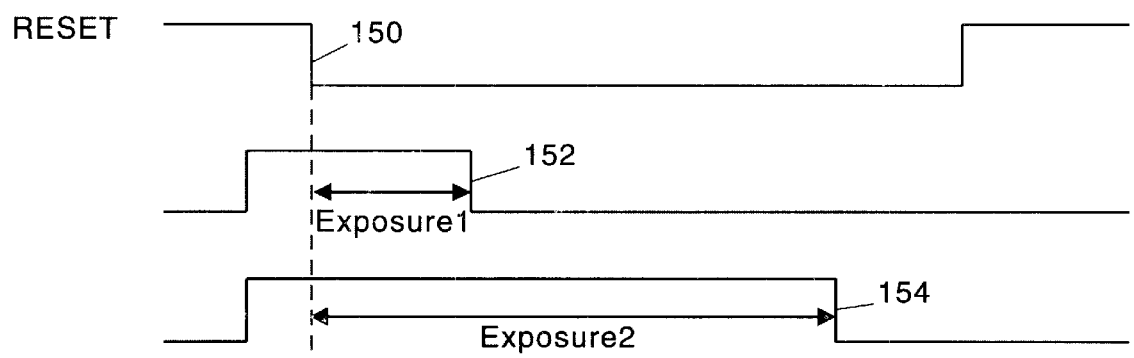

In the operation of the active pixel sensors 100-1 through 100-4 of FIGS. 11 through 14, the active pixel sensors are reset and charge is accumulated in a manner similar to that described above with respect to the pixel sensor of FIG. 6. For the operation of active pixel sensor 100-5, alternative timing diagrams are depicted in FIGS. 16A and 16B.

In each of the embodiments of the active pixel sensors 100-1 through 100-5, the first N-doped region 82 is coupled to a source of N-channel MOS reset transistor 102-1, the P-doped region 84 is coupled to a drain of N-channel MOS reset transistor 102-2, and the second N-doped region 86 is coupled to a source of N-channel MOS reset transistor 102-3. The drains of N-channel MOS reset transistors 102-1 and 102-3 are coupled to reference voltage Vn, and the source of N-channel MOS reset transistor 102-2 is coupled to a reference voltage Vp<Vn. The gates of N-channel MOS reset transistors 102-1 and 102-3 are connected to a RESET-N control line 104, and the gate of N-Channel MOS reset transistor 102-2 is connected to a RESET-P control line 106.

The potential Vn coupled to the drains of N-channel MOS reset transistors 102-1 and 102-3 are substantially positive with respect to the P-type silicon substrate, and the potential Vp coupled to the drain of N-Channel MOS reset transistor 102-2 is less positive than Vn, so that all three photodiodes start out in a reverse biased state when the to RESET-N and RESET-P signals are applied. As the photodiodes in the triple-diode color photosensor structure 78 are exposed to light, they become less reverse biased, and can even become somewhat forward biased before they "overflow." The three voltages sensed will correspond to different linear combinations of the photocharges, depending on the values of the various photodiodes and stray capacitances of the circuit. These linear combinations affect the resulting sensitivity curves for the voltage output and, hence, are corrected for in the matrix transformation that follows to produce a colorimetrically sensible final output.

Further, the active pixel sensors 100-1 through 100-5 each include a plurality of storage nodes 108-1, 108-2 and 108-3. For example, storage node 108-1 comprises the common connection of the first terminal of a storage element 110-1, a first source/drain of N-channel MOS transfer transistor 112-1, and the gate of N-channel MOS readout transistor 114-1. Storage node 108-2 comprises the common connection of the first terminal of storage element 110-2, a first source/drain of N-channel MOS transfer transistor 112-2, and the gate of N-channel MOS readout transistor 114-2. Storage node 108-3 comprises the common connection of the first terminal of a storage element 110-3, a first source/drain of N-channel MOS transfer transistor 112-3, and the gate of N-channel MOS readout transistor 114-3. The gates of N-channel 112-1, 112-2 and 112-3 are connected to a global transfer signal on XFR line 116. The storage elements 110-1, 110-2, and 110-3 each have a second terminal connected to a fixed potential shown as ground.

Figure 11:
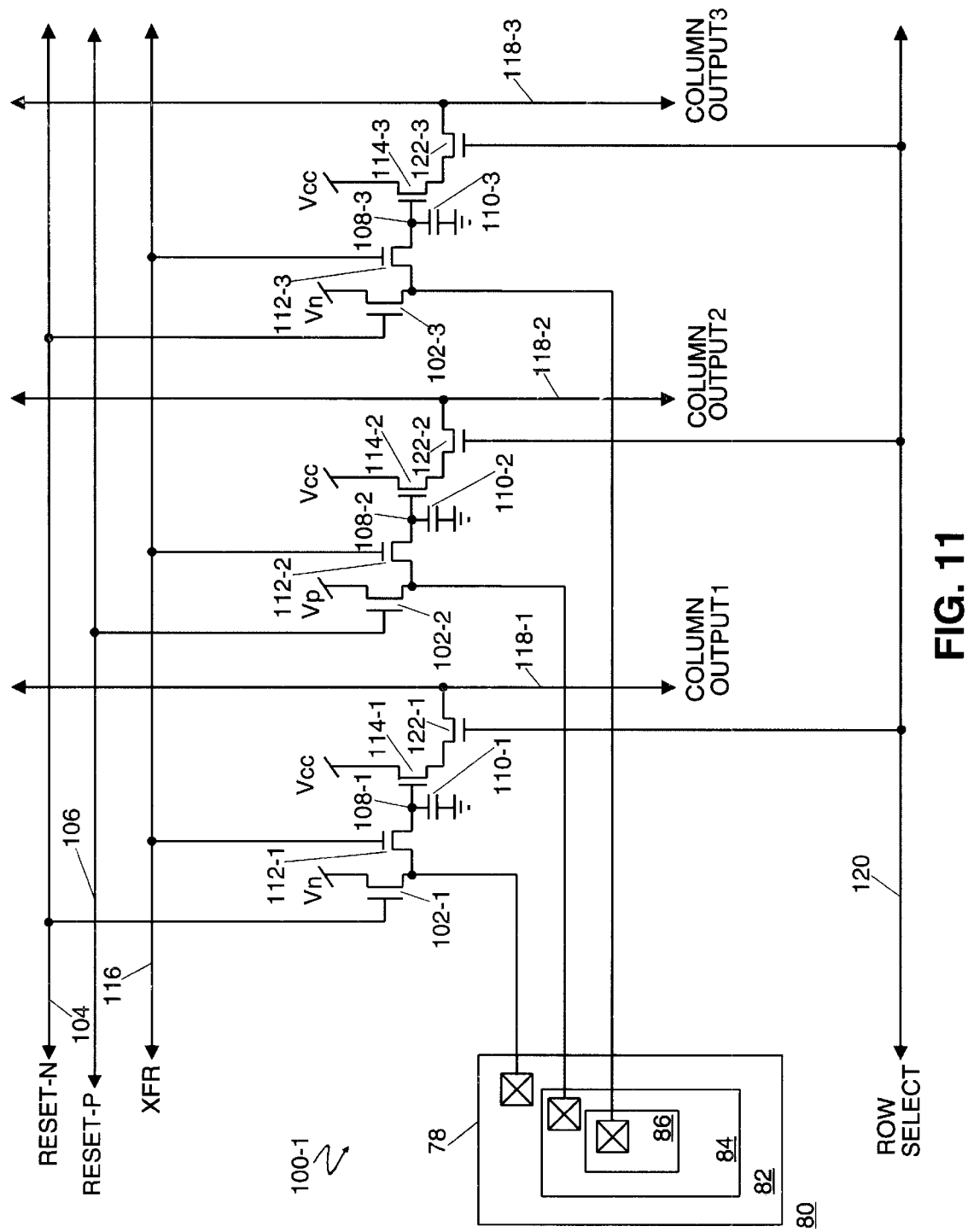
FIGS. 11, 12, 13, 14, and 15 are schematic diagrams of active pixel sensors having multiple storage nodes according to first through fifth embodiments of the present invention.

Referring to the embodiment 100-1 of an active pixel sensor according to the present invention as seen in FIG. 11, voltages present on storage nodes 108-1 through 108-3 are read out onto separate column output lines 118-1 through 118-3, respectively, by a single row select signal on ROW SELECT line 120. Accordingly, the drain of each N-channel MOS readout transistor 114-1 through 114-3 is connected to Vcc, and the source of each N-channel MOS readout transistor 114-1 through 114-3 is connected to the drain of one of N-channel MOS row select transistors 122-1 through 122-3, respectively. The gates of N-channel MOS row select transistors 122-1 through 122-3 are each connected to the ROW SELECT line 120, and the sources of N-channel MOS row select transistors 122-1 through 122-3 are connected to the column output lines 118-1 through 118-3, respectively.

In the operation of the active pixel sensor 100-1, during the reading out of the images on the column output lines 118-1 through 118-3, column circuits (not shown) connected to the column output lines 118-1 through 118-3, respectively, may be used to select a pixels representing a stored image provided on the storage nodes 108-1 through 108-3. Further, column circuits may be used to perform some function on the stored pixels, such as performing a linear combination of the sensed color signals.

Figure 12:
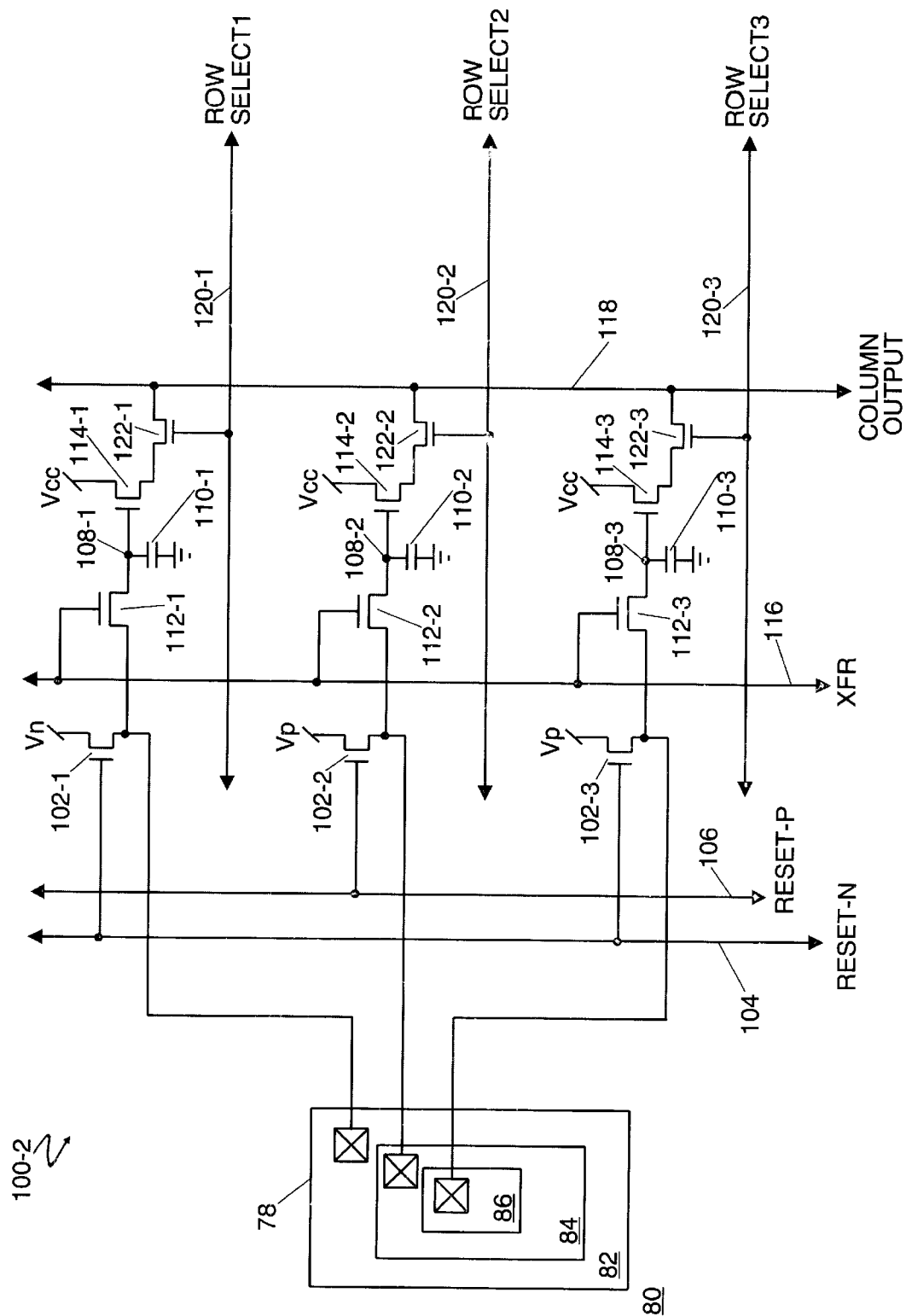

Referring now to FIG. 12, in the embodiment 100-2 of an active pixel sensor according to the present invention, voltages present on the storage nodes 108-1 through 108-3 are read out separately onto the same column output line 118, by separately asserting ROW SELECT1 through ROW SELECT3 signals. Accordingly, the drain of each N-channel MOS readout transistor 114-1 through 114-3 is connected to Vcc, and the source of each N-channel MOS readout transistor 114-1 through 114-3 is connected to the drain of N-channel MOS row select transistors 122-1 through 122-3, respectively. The gates of N-channel MOS row select transistors 122-1 through 122-3 are each connected to respective ones of ROW SELECT1 through ROW SELECT3 lines 120-1 through 120-3, respectively, and the sources of N-channel MOS row select transistors 122-1 through 122-3 are connected to the single column output line 118.

In the operation of active pixel sensor 100-2 of FIG. 12, the image stored on storage node 108-1 will be read out in response to a HIGH ROW SELECT1 signal, the image stored on storage node 108-2 will be read out in response to a HIGH ROW SELECT2 signal, and the image stored on storage node 108-3 will be read out in response to a HIGH ROW SELECT3 signal. It should be understood that the imager 30 depicted in FIG. 5 will further include additional decoding circuits for providing the signals on ROW SELECT1 through ROW SELECT3 lines.

Figure 13:
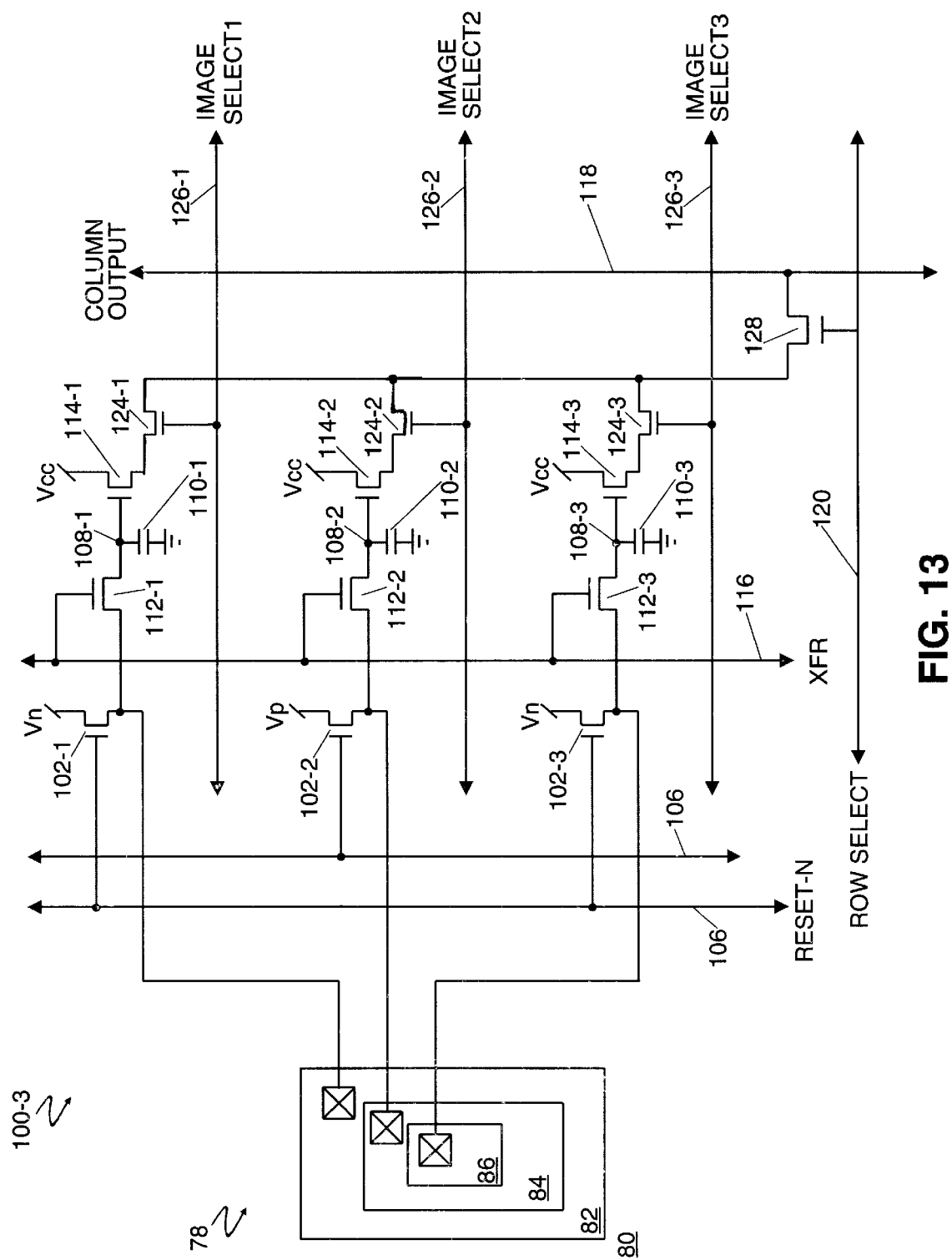

Referring now to FIG. 13, in the active pixel sensor embodiment 100-3, voltages present on storage nodes 108-1 through 108-3 are read out separately onto a single column output line 118 in response to signals on IMAGE SELECT1 through IMAGE SELECT3 lines 126-1 through 126-3, applied to the gates of N-channel MOS image select transistors 124-1 through 124-3, respectively, and a signal on ROW SELECT line 120. Accordingly, the drains of N-channel MOS readout transistors 114-1 through 114-3 are each connected to Vcc, and the sources of N-channel MOS readout transistors 114-1 through 114-3 are connected to the drains of N-channel MOS image select transistors 124-1 through 124-3, respectively. The gates of N-channel MOS image select transistors 124-1 through 124-3 are connected to IMAGE SELECT1 through IMAGE SELECT3 lines 126-1 through 126-3, respectively. The sources of N-channel MOS image select transistors 124-1 through 124-3 are all connected to the drain of N-channel MOS row select transistors 128. The gate of N-channel MOS row select transistor 128 is connected to a ROW SELECT line 120, and the source of N-channel MOS row select transistor 128 is connected to a column output line 118.

In the operation of active pixel sensor 100-3, the image stored on storage node 108-1 will be read out in response to a high signal asserted on ROW SELECT line 120 and a high signal asserted n IMAGE SELECT1 line 126-1. The image stored on storage node 108-2 will be read out in response to a high signal asserted on ROW SELECT line 120 and a high signal asserted on IMAGE SELECT2 line 126-2. The image stored on storage node 108-3 will be read out in response to a high signal asserted on ROW SELECT line 120 and a high signal asserted on IMAGE SELECT3 line 126-3. It should be understood that the imager 30 depicted in FIG. 5 will further include global IMAGE SELECT1 through IMAGE SELECT3 lines. The use of the global IMAGE SELECT1 through IMAGE SELECT3 signals in combination with the ROW SELECT signal eliminates the need for the additional row decoding required in the embodiment of FIG. 12.

Figure 14:
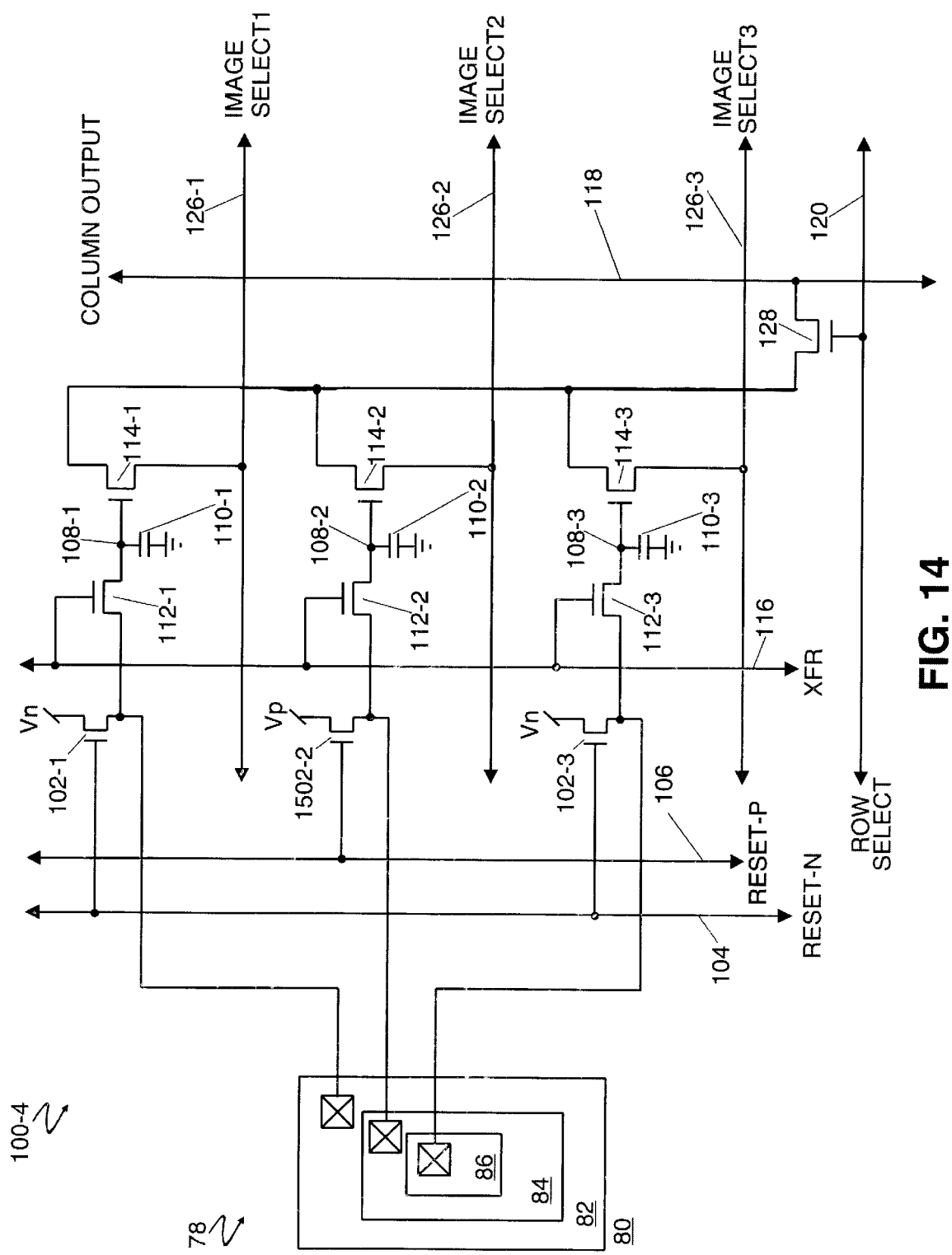

Referring now to FIG. 14, in the active pixel sensor embodiment 100-4, voltages present on storage nodes 108-1 through 108-3 are read out in a current mode onto a single column output line 118 in response to signals asserted on IMAGE SELECT1 through IMAGE SELECT3 lines 126-1 through 126-3, respectively, and a signal asserted on ROW SELECT line 120. Accordingly, the drains of N-channel MOS readout transistors 114-1 through 114-3 are connected together, and to the source of an N-channel MOS row select transistor 128. The sources of N-channel MOS readout transistors 112-1 through 114-3 are connected to IMAGE SELECT1 through IMAGE SELECT3 lines 126-1 through 126-3, respectively. The gate of N-channel MOS row select transistor 128 is connected to a ROW SELECT line 120, and the drain of N-channel MOS row select transistor 128 is connected to a column output line 118.

In the operation of active pixel sensor 100-4, the column output line 118 is connected to the drain of the N-channel MOS row select transistor 128. To place current representing the stored image on the column output line 118, the image stored at storage node 108-1 will be selected by a low signal asserted on IMAGE SELECT1 line 126-1, the image stored at storage node 108-2 will be selected by a low signal asserted on IMAGE SELECT2 line 126-2, and the image stored at storage node 108-3 will be selected by a low signal asserted on IMAGE SELECT3 line 126-3. The current-mode output on column output line 128 is therefore controlled by the signals on IMAGE SELECT1 through IMAGE SELECT3 lines 126-1 through 126-3. The column output line 128 output must be kept biased to a high enough voltage that the non-selected N-channel MOS readout transistors 114-1 through 114-3 do not start conducting backward. Further, it should be appreciated that the voltage drivers for the IMAGE Select1 through IMAGE SELECT3 lines 126-1 through 126-3 must be capable of sinking all the column current from the selected row.

Figure 15:
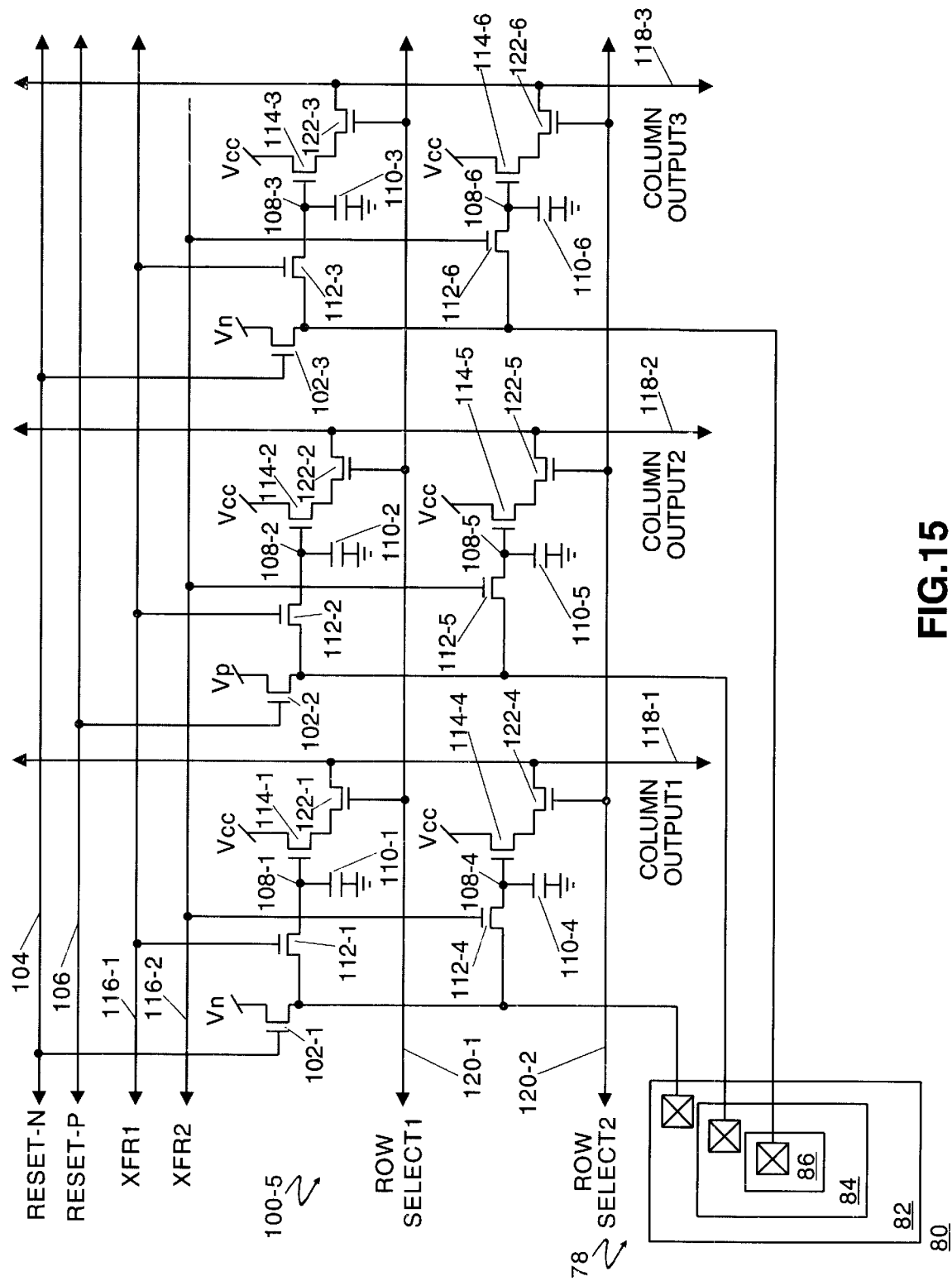

Referring now to FIG. 15, an active pixel sensor embodiment 100-5 is seen to resemble the embodiment of FIG. 11 and includes additional storage nodes to demonstrate that the multiple storage nodes may be matrixed using ROW SELECT1 through ROW SELECT2 and COLUMN OUPUT1 through COLUMN OUTPUT3. In most respects, the embodiment of FIG. 15 functions in the same manner as the embodiment of FIG. 11.

In the active pixel sensor 100-5 shown in FIG. 15, the voltages present on storage nodes 108-1 through 108-3 are read out onto column output lines 118-1 through 118-3, respectively, by the signal on ROW SELECT1 line 120-1, and the voltages present on storage nodes 108-4 through 108-6 are read out onto column output lines 118-1 through 118-3, respectively, by the signal on ROW SELECT2 line 120-2. Accordingly, the drain of each N-channel MOS readout transistors 114-1 through 114-6 are connected to Vcc, and the source of each N-channel MOS readout transistor 114-1 through 114-6 is connected to the drain of an N-channel MOS row select transistor 122-1 through 122-6, respectively. The gates of N-channel MOS row select transistors 122-1 through 122-3 are each connected to the ROW SELECT1 line 120-1, and the gates of N-channel MOS row select transistors 122-4 through 122-6 are each connected to the ROW SELECT2 line 120-2. The sources of N-channel MOS row select transistors 122-1 and 122-4 are connected to first column output line 118-1, the sources of N-channel MOS row select transistors 122-2 and 122-5 are connected to second column output line 118-2, and the sources of N-channel MOS row select transistors 122-3 and 122-6 are connected to third column output line 118-3.

In the operation of the active pixel sensor 100-5, charge stored on any of the storage nodes 108-1 through 108-6 in is read out in response to the assertion of signals on either of the ROW SELECT1 and ROW SELECT2 lines applied to the gates of N-channels MOS row select transistors 122-1 through 122-3 or 122-4 through 122-6 to which the storage nodes 108-1 through 106-3 or 108-4 through 108-6, respectively, are coupled and by sensing the column output lines 118-1 through 118-3 to which the storage nodes are coupled.

Figure 1:
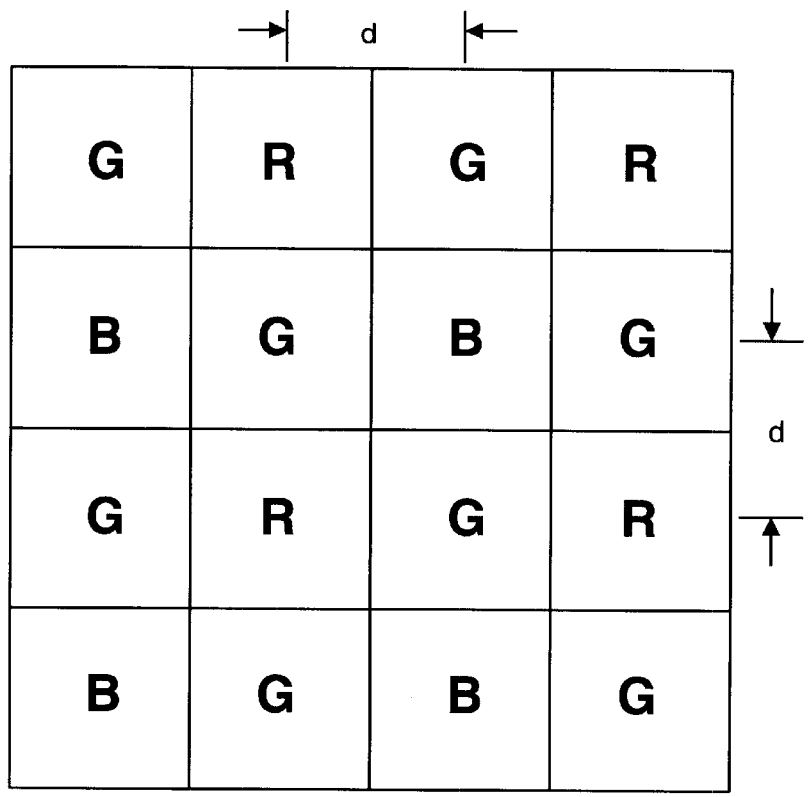
FIG. 1 illustrates the well-known Bayer color filter array (CFA) pattern.
Figure 2:
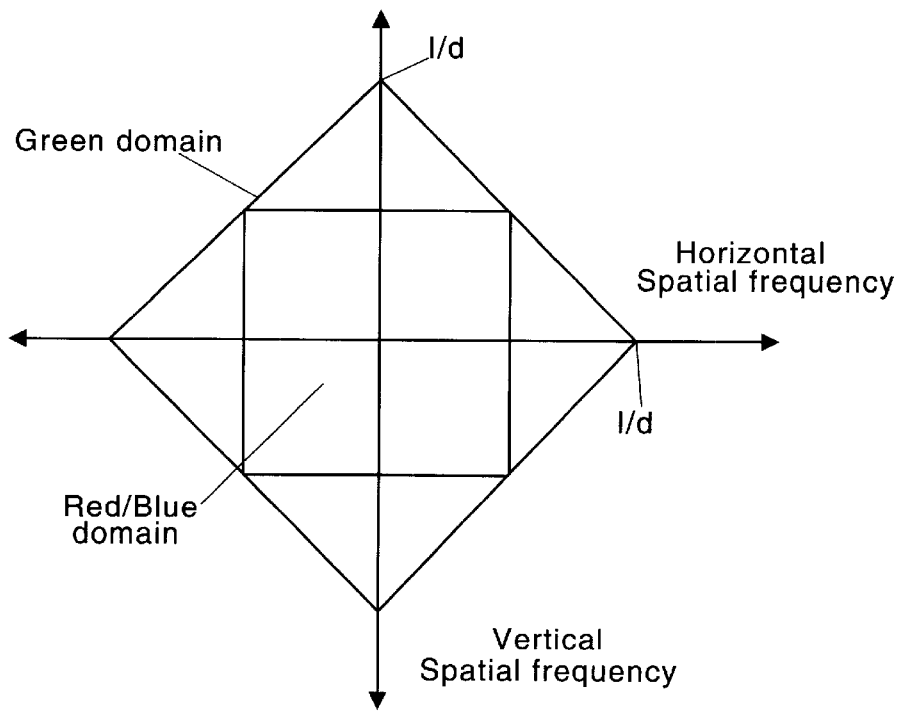
FIG. 2 illustrates the Nyquist domains for red, green and blue resulting from the Bayer CFA of FIG. 1.
Figure 3:
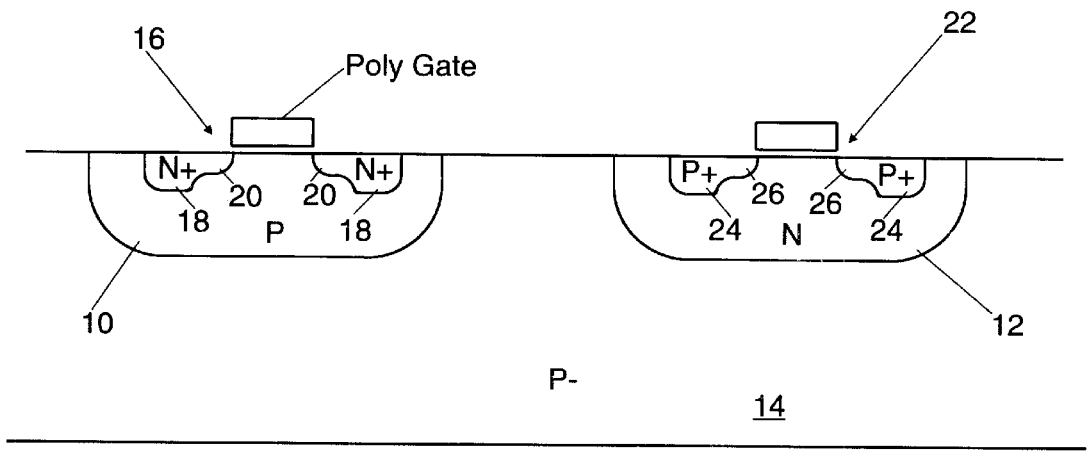
FIG. 3 is a partial cross-section drawing illustrating a conventional twin-well CMOS structure.
Figure 4:
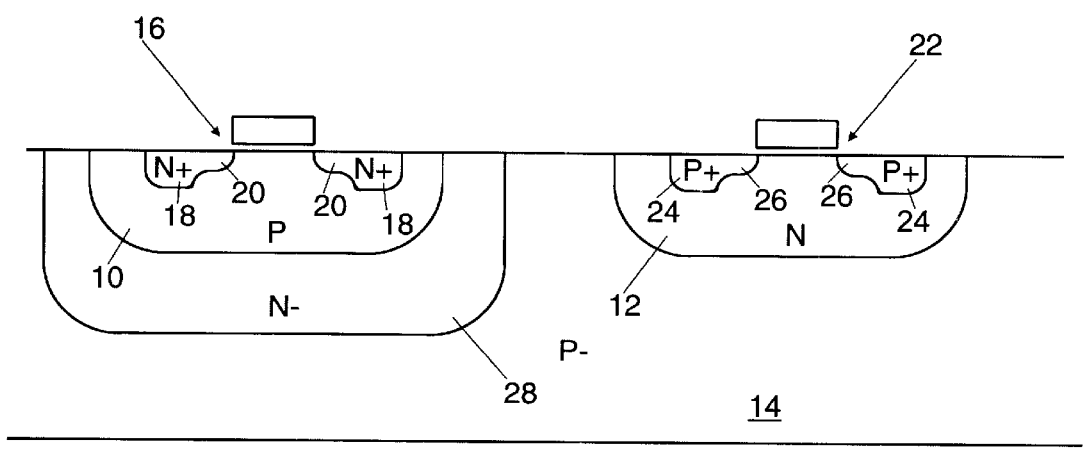
FIG. 4 is a partial cross-section drawing illustrating a conventional triple-well CMOS structure.

For example, to select a pixel information stored on the storage node 108-1, the signal on ROW SELECT1 line 120-1 will be asserted and the first column output line 118-1 will be sensed. In embodiments where multiple storage nodes are employed, the matrixing of the storage nodes 108-1 through 108-6 using ROW SELECT1 and ROW SELECT2 lines 120-1 and 120-2 and first, second, and third column output lines 118-1, 118-2, and 118-3 reduces the number of additional row and column lines required. It should also be understood that instead of the single global XFR line depicted in FIG. 1 that first and second global transfer lines XFR1 and XFR2 (shown at reference numerals 116-1 and 116-2) will be employed, allowing for motion sensing, multiple exposure times, and the like.

FIGS. 16A and 16B are timing diagrams showing the RESET-N, RESET-P, XFR1 and XFR2 signals and illustrating the operation of active pixel sensor 100-5. In FIG. 16A, with XFR1 signal asserted high on line 116-1, the RESET-N and RESET-P signals (shown for simplicity as a single RESET signal) make a transition at falling edge 130 to begin the accumulation of charge on storage nodes 108-1, 108-2, and 108-3. The XFR1 signal then makes a transition at falling edge 132, halting the accumulation of charge on storage nodes 108-1, 108-2, and 108-3. The RESET signal is then makes a transition at rising edge 134 to reset the voltage of the photodiodes in the three-diode color photosensor structure 78. The XFR2 signal on line 116-2 then makes a transition at rising edge 136. When the RESET signal makes a transition at falling edge 138, accumulation of charge on storage nodes 108-4, 108-5, and 108-6 begins. The XFR2 signal on line 116-2 then makes a transition at falling edge 140, halting the accumulation of charge on storage nodes 108-4, 108-5, and 108-6.

In FIG. 16B, with XFR1 and XFR2 lines both asserted high, the RESET signal makes a transition at falling edge 150 to begin the accumulation of charge on storage nodes 106-1, 106-2, 106-3, 106-4, 106-5, and 106-6. The XFR1 signal then makes a transition at falling edge 152, halting the accumulation of charge on storage nodes 106-1, 106-2, and 106-3. The accumulation of charge on storage nodes 108-4 108-5, and 108-6 continues. Then XFR2 signal makes a transition at falling edge 154, halting the accumulation of charge on storage nodes 106-4, 106-5, and 106-6.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An active pixel sensor disposed on a semiconductor substrate of a first conductivity type, comprising:

a plurality of semiconductor regions, a first one of said semiconductor regions disposed in the substrate, each successive one of said semiconductor regions being enclosed entirely within another enclosing one of said semiconductor regions, said plurality of semiconductor regions alternating between the first conductivity type and a second conductivity type opposite to that of said first conductivity type, said first one of said semiconductor regions containing all successive ones of said semiconductor regions being of said second conductivity type, such that a plurality of series-connected photodiodes is formed between said substrate and an innermost enclosed one of said semiconductor regions;

a plurality of reset switches, each one of said plurality of reset switches having a first terminal coupled to a different one of said alternating semiconductor regions, each one of said plurality of reset switches having a second terminal switchably coupled to a reset potential; and a plurality of storage nodes, each one of said plurality of storage nodes coupled to a separate one of said plurality of alternating semiconductor regions.

2. The active pixel sensor of claim 1, wherein said first conductivity type is p-type and said second conductivity type is n-type.

3. The active pixel sensor of claim 1, wherein said first conductivity type is n-type and said second conductivity type is p-type.

4. The active pixel sensor of claim 1, wherein said plurality of photodiodes includes a red light sensitive photodiode, a green light sensitive photodiode, and a blue light sensitive photodiode.

5. The active pixel sensor of claim 1 wherein said plurality of series connected photodiodes are formed from junctions existing at interfaces between adjacent ones of said semiconductor regions, said interfaces having portions substantially parallel to an upper surface of said substrate, said portions disposed at depths from said upper surface selected to exhibit photocharge activity from light of preselected wavelengths.

6. An active pixel sensor as in claim 1, further including readout means coupled to said plurality of storage nodes for providing an output signal therefrom related to charge stored on said plurality of storage nodes.

7. An active pixel sensor as in claim 1, further including a plurality of transfer switches, each of said transfer switches coupled between a different one of said semiconductor regions and one of said plurality of storage nodes, each of said transfer switches responsive to a transfer signal.

8. An active pixel sensor as in claim 1, further including a plurality of readout switches, each of said readout switches coupled between a different one of said plurality of storage nodes and an output conductor, each of said readout switches responsive to a readout signal.

9. An active pixel sensor as in claim 1, wherein each of said storage nodes includes a capacitive storage element.

10. An active pixel sensor disposed on a semiconductor substrate of a first conductivity type, comprising:

a first well having a second conductivity type opposite to that of said first conductivity type disposed in said substrate;

a second well having said first conductivity type disposed within said first well;

a region of said second conductivity type disposed in said second well;

a plurality of reset switches, each one of said plurality of reset switches having a first terminal coupled to a different one of said first well, said second well, and said region of said second conductivity type, each one of said plurality of reset switches having a second terminal switchably coupled to a reset potential; and a plurality of storage nodes, each one of said plurality of storage nodes coupled to a separate one of said first well, said second well, and said region of said second conductivity type.

11. The active pixel sensor of claim 10, wherein said first conductivity type is p-type and said second conductivity type is n-type.

12. The active pixel sensor of claim 10, wherein said first conductivity type is n-type and said second conductivity type is p-type.

13. The active pixel sensor of claim 10, wherein said plurality of photodiodes includes a red light sensitive photodiode, a green light sensitive photodiode, and a blue light sensitive photodiode.

14. The active pixel sensor of claim 10 wherein said plurality of series connected photodiodes are formed from junctions existing at interfaces between adjacent ones of said semiconductor regions, said interfaces having portions substantially parallel to an upper surface of said substrate, said portions disposed at depths from said upper surface selected to exhibit photocharge activity from light of preselected wavelengths.

15. An active pixel sensor as in claim 10, further including readout means coupled to said plurality of storage nodes for providing an output signal therefrom related to charge stored on said plurality of storage nodes.

16. An active pixel sensor as in claim 10, further including a plurality of transfer switches, each of said transfer switches coupled between a different one of said semiconductor regions and one of said plurality of storage nodes, each of said transfer switches responsive to a transfer signal.

17. An active pixel sensor as in claim 10, further including a plurality of readout switches, each of said readout switches coupled between a different one of said plurality of storage nodes and an output conductor, each of said readout switches responsive to a readout signal.

18. An active pixel sensor as in claim 10, wherein each of said storage nodes includes a capacitive storage element.

\* \* \* \* \*